United States Patent [19]

Hart

[11] Patent Number: 4,971,863

[45] Date of Patent: Nov. 20, 1990

[54] METALLIZED FILMS HAVING AN ADHERENT COPOLYESTER COATING

[75] Inventor: Charles R. Hart, Yarm, England

[73] Assignee: Imperial Chemical Industries PLC, London, England

[21] Appl. No.: 263,257

[22] Filed: Oct. 27, 1988

[30] Foreign Application Priority Data

Jun. 22, 1988 [GB] United Kingdom ............... 8814789

[51] Int. Cl.$^5$ ................. B32B 15/08; B32B 27/36
[52] U.S. Cl. ................................. 428/458; 427/402; 427/404; 427/412.5; 427/419.8; 428/480; 524/603
[58] Field of Search ............... 428/458, 480; 524/603; 427/402, 404, 412.5, 419.8

[56] References Cited

U.S. PATENT DOCUMENTS

| | | | |
|---|---|---|---|
| 3,563,942 | 2/1971 | Heiberger | 524/603 X |
| 4,340,519 | 7/1982 | Kotera et al. | 428/458 X |
| 4,476,189 | 10/1984 | Posey et al. | 428/480 X |
| 4,478,907 | 10/1984 | Van Gossum et al. | 428/480 X |
| 4,525,419 | 6/1985 | Posey et al. | 428/480 X |
| 4,585,687 | 4/1986 | Posey et al. | 428/480 X |
| 4,704,325 | 11/1987 | Crocker | 428/323 |

*Primary Examiner*—Thomas J. Herbert
*Attorney, Agent, or Firm*—Cushman, Darby & Cushman

[57] ABSTRACT

A metallized polymeric film comprises a sulphonated copolyester intermediate adherent layer having an alkali metal content of not more than 0.005 gram atoms percent.

11 Claims, No Drawings

METALLIZED FILMS HAVING AN ADHERENT COPOLYESTER COATING

This invention relates to a metallised film and, in particular, to a metallised film comprising a primed polymeric substrate.

Metallic foils, such as aluminum foil, which hitherto have been employed as packaging materials for snack foods, baker products, potato crisps, coffee beans etc., are increasingly being replaced by less costly metallised film composite structures comprising a substrate of a polymeric film coated with a thin metallic layer. The polymeric film substrate generally provides a strong, flexible packaging medium offering desirable oxygen and moisture barrier properties, and these characteristics are supplemented by the presence of the metallic layer which additionally provds a barrier to visible and ultra-violet light thereby delaying the onset of oxidative degradation to which certain packaged products are vulnerable.

To promote adhesion between a polymeric film and a subsequently deposited metallic layer it is advantageous to employ an intermediate priming layer. Thus, it has been proposed to prepare a metallised polymeric film by providing on a polymer film base a priming layer of a sulphonated copolyester comprising isophthalic acid, optionally an aliphatic dicarboxylic acid, a sulphomonomer containing an alkali metal sulphonate group attached to a dicarboxylic aromatic nucleus and an aliphatic or cycloaliphatic alkylene glycol, and applying thereto a metallic layer by a vapour deposition technique. Even so, commercially available metallised films are prone to rupture by failure of the adhesive bond between the substrate and metallic layer, particularly if a film package is exposed to impacts, or otherwise mishandled- for example, by being accidentally dropped onto a relatively solid surface. Such films also exhibit inferior humid ageing characteristics.

We have now devised a metallised film which provides a solution to the aforementioned problems.

Accordingly, the present invention provides a metallised film comprising a substrate layer of a synthetic polymeric material having, on at least one surface thereof, an adherent layer, and a metallic layer on the surface of the at least one adherent layer remote from the substrate, the adherent layer comprising a copolyester resin derived from (a) an aromatic polycarboxylic acid, or polyester-forming equivalent thereof, (b) a sulphonic acid derivatives of an aromatic polycarboxylic acid, or polyester-forming equivalent thereof, and (c) a stoichiometric amount of at least one polyhydric alcohol, or polyester-forming equivalent thereof, wherein the alkali metal content of the copolyester resin is not more than 0.005 gramme atoms percent.

The invention also provides a method of producing a metallised film by forming a substrate layer of a synthetic polymeric material, applying to at least one surface thereof an adherent layer, and depositing a metallic layer on the surface of the at least one adherent layer remote from the substrate, wherein the adherent layer comprises a copolyester resin derived from (a) an aromatic polycarboxylic acid, or polyester-forming equivalent thereof, (b) a sulphonic acid derivatives of an aromatic polycarboxylic acid, or polyester-forming equivalent thereof, and (c) a stoichiometric amount of at least one polyhydric alcohol, or polyester-forming equivalent thereof, wherein the alkali metal content of the copolyester resin is not more than 0.005 gramme atoms percent.

The unit "gramme atoms per cent" defines the alkali metal content in terms of the number of gramme atoms of alkali metal present in 100 grammes of the adherent copolyester resin.

The sulphonic acid derivatives comprises a group of formula $-SO_3R$, attached to a dicarboxylic aromatic nucleus, wherein R is essentially hydrogen, ammonium or substituted ammonium, - such as dimethylaminomethanol.

Formation of the adherent polyester resin is conveniently effected in known manner by condensation, or ester-interchange, at temperatures of up to 275° C., and in the presence of a catalyst, of (a) at least one unsulphonated aromatic polycarboxylic acid, preferably a dicarboxylic acid, or a polyester-forming equivalent thereof, such as an anhydride or lower alkyl (up to ten carbon atoms in the alkyl group, preferably methyl) ester thereof, (b) at least one sulphonated polycarboxylic acid, preferably a dicarboxylic acid, or a polyester-forming equivalent thereof, such as an anhydride or lower alkyl (up to 10° C.) ester thereof, and (c) at least one polyhydric alcohol. A suitable method for the preparation of the sulphonated polyester resin is disclosed in U.S. Pat. No. 3,734,874.

Unsulphonated aromatic polycarboxylic acids suitable for incorporation into the adherent polyester resin include phthalic acid, terephthalic acid, and, particularly, isophthalic acid or the acid anhydrides or lower alkyl (up to 10° C.) esters thereof. Mixtures of two or more thereof, particularly those containing a predominant amount (50 mole %) of isophthalic acid may also be employed.

Suitable sulphonated polycarboxylic acids for incorporation into the adherent polyester resin include-4-sulphophthalic acid, 5-sulphoisophthalic acid and sulphoterephthalic acid, or the acid anhydrides or lower alkyl (up to 10° C.) esters thereof. Such acids, or derivatives, are available as alkali metal salts, particularly the sodium sulphonate salt, and are conveniently incorporated in salt form into the adherent polyester resin. Thereafter, the alkali metal content is reduced to the desired level -for example by passing an aqueous dispersion of the polyester resin through a mixed bed deionisation column.

Suitable polyhydric alcohols for incorporation into the adherent polyester resin include aliphatic and cycloaliphatic alkylene glycols, such as ethylene glycol, 1-2, propylene glycol, neopentyl glycol, cyclohexane-1,4-dimethanol and 1,3-propane diol, and particularly aliphatic alkylene-oxy glycols, such as diethylene glycol.

The adherent polyester resin may additionally comprise at least one aliphatic or cycloalophatic dicarboxylic acid, such as cyclohexane-1,4-dicarboxylic acid, adipic acid, sebacic acid, trimellitic acid or itaconic acid, or polyester-forming equivlents thereof.

If desired, the adherent polyester resin may be modified by the inclusion therein of one or more monohydric alcohols, such as ethylene glycol monobutyl ether, benzyl alcohol and cyclohexanol.

To ensure the production of a metallised film exhibiting an acceptable combination of metal adhesion to the substrate and adequate resistance to deterioration on humid ageing, the alkali metal content of the adherent polyester resin should not exceed 0.005 gramme atoms percent. Preferably, however, the alkali metal content should not exceed 0.001, and particularly 0.0005, gramme atoms percent. Although the pendant sulphonate groups may be in the free acid form, by total elimination of alkali metal, particularly acceptable behaviour is achieved when the alkali metal content of the adherent polyester resin is within a range of from 0.0001 to 0.0005 gramme atoms percent.

The concentration of the aromatic polycarboxylic component in the adherent resin is preferably within a range of from 60 to 98 mole %, and particularly from 88 to 94 mole %, of the total acidic components of the adherent resin, while the sulphonic acid component is preferably present in a concentration of from 2 to 20 mole %, particularly from 6 to 12 mole %, of the total acidic components of the adherent resin. The polyhydric alcohol is correspondingly present in a stoichiometrically equivalent amount of approximately 100 mole %.

The optional aliphatic or cycloaliphatic dicarboxylic acid component may be present in an amount of up to about 38 mole %, preferably from 0 to 6 mole %, of the total acidic components of the adherent resin.

A preferred adherent polyester resin comprises residues of isophthalic acid, a sulphonic acid derivative of isophthalic and/or terephthalic acid, and diethylene glycol.

If desired, and preferably, the adherent polyester resin may be cross-linked to improve its durability, hardness, cohesive strength and adhesion to the substrate, and to provide resistances to attack by solvents. Cross-linking may be promoted by incorporation into the resin of any cross-linking agent known to be effective in polyesters. Suitable cross-linking agents include the condensation products of an amine with an aldehyde. For example, melamine, diazine, urea, cyclic ethylene urea, cyclic propylene urea, thiourea, cyclic ethylene thiourea, an alkyl melamine, such as butyl melamine, an aryl melamine, a guanamine, an alkylguanamine, an aryl guanamine, a benzoguanamine, or glycoluril, may be condensed with an aldehyde, such as formaldehyde. The condensation product is preferably alkoxylated, eg ethoxylated. A preferred cross-linking agent is a methylated melamine-formaldehyde resin.

The amount of cross-linking agent necessary to promote the required degree of cross-linking will depend, inter alia, on the selected sulphonic acid derivative of polycarboxylic acid, and may be readily determined by simple experimentation. In general, the cross-linking agent suitably comprises up to 25%, and preferably from 2 to 20%, by weight of the sulphonated polycarboxylic acid component of the adherent resin.

Acceleration of the cross-linking may be effected, if desired, by adding a suitable catalyst to the adherent polyester resin. A preferred catalyst for use with an amine-formaldehyde cross-linking agent comprises ammonium chloride, ammonium nitrate, phoshoric acid, citric acid, p-toluene sulphonic acid or p-dodecylbenzenesulphonic acid.

The adherent polyester resin is conveniently applied to the substrate in the form of an aqueous solution or dispersion. Application from an aqueous medium is economically advantageous, avoids the potential explosive and toxicity hazards associated with the use of volatile organic solvents, and eliminates the problem of residual odour frequently encountered when an organic solvent is employed. A polyester resin with a relatively high sulphonic acid group content can generally be dispersed in hot water alone. However, if the polyester resin is insufficiently polar to disperse or dissolve unaided, dispersion can be accomplished by incorporation of a suitable surfactant. It may be advantageous to dissolve the polyester in a small amount of an organic solvent prior to dispersion in water.

To achieve good wetting and levelling properties of the aqueous sulphonic-acid containing polyester resin on a thermoplastic film substrate, it may be necessary to add a wetting agent, for example an alkyl benzene sulphonate, sodium alkyl sulphosuccinate or alcohol ethoxylate.

Deposition of the aqueous solution or dispersion of the adherent polyester resin onto the polymeric substrate layer is effected by conventional film coating techniques- for example, by gravure roll coating, reverse roll coating, dip coating, bead coating, slot coating or electrostatic spray coating. The solution or dispersion is suitably applied in an amount such that the thickness of the adherent resin layer when dried, for example- by heating the coated substrate, will provide an effective bond to the subsequently applied metal layer. Conveniently, the thickness of the dried, adherent resin layer is of the order of 1 $\mu$m, or less, and preferably in a range of from 10 to 100 nanometres (nm).

The substrate of a metallised film according to the invention may be formed from any synthetic, film-forming polymeric material. Suitable thermoplastics materials include a homopolymer or copolymer of a 1-olefin, such as ethylene, propylene and but-1-ene, a polyamide, a polycarbonate, and, particularly, a synthetic linear polyester which may be obtained by condensing one or more dicarboxylic acids or their lower alkyl (up to 6 carbon atoms) diesters, eg terephthalic acid, isophthalic acid, phthalic acid, 2,5-2,6-or 2,7-naphthalenedicarboxylic acid, succinic acid, sebacic acid, adipic acid, azelaic acid, 4,4'-diphenyldicarboxylic acid, hexahydroterephthalic acid or 1,2-bis-p-carboxyphenoxyethane (optionally with a monocarboxylic acid, such as pivalic acid) with one or more glycols, eg ethylene glycol, 1,3-propanediol, 1,4-butanediol, neopentyl glycol and 1,4-cyclohexanedimethanol. A polyethylene terephthalate film is particularly preferred, especially such a film which has been biaxially oriented by sequentil stretching in two mutually perpendicular directions, typically at a temperature in the range 78° to 125° C., and preferably heat set, typically at a temperature in the range 150° C. for example - as described in British patent No. 838708.

The substrate may also complete a polyarylether or thio analogue thereof, particularly a polyaryletherketone, polyarylethersulphone, polyarylether etherketone, polyarylether ethersulphone, or a copolymer or thioanalogue thereof. Examples of these polymers are disclosed in EP-A-1879, EP-A-184458 and U.S. Pat. No. 4008203, particular suitable materials being those sold by ICI Chemicals and Polymers Ltd under the Registered Trade Mark STABAR. Blends of these polymers may also be employed.

Suitable thermoset resin substrate materials include addition —polymerization resins—such as acrylics, vinyls, bis-maleimides and unsaturated polyesters, formaldehyde condensate resins- such as condensates with urea, melamine or phenols, cyanate resins, isocyanate resins, epoxy resins, functionalised polyesters, polyamides or polyimides.

A polymeric film substrate for production of a metallised film according to the invention may be unoriented, or uniaxially oriented, but is preferably biaxially oriented. A thermoplastics polymeric substrate is conveniently biaxially oriented by drawing in two mutually perpendicular directions in the plane of the film to achieve a satisfactory combination of mechanical and physical properties. Simultaneous biaxial orientation may be effected by extruding a thermoplastics polymeric tube which is subsequently quenched, reheated and then expanded by internal gas pressure to induce transverse orientation, and withdrawn at a rate which will induce longitudinal orientation. In such a simultaneous stretching process, the adherent coating medium is suitably applied to the substrate either before commencement or after conclusion of the stretching operation. Sequential stretching may be effected in a stenter process by extruding the thermoplastics substrate material as a flat extrudate which is subsequently stetched first in one direction and then in the other mutually perpendicular direction. Generally, it is preferred to stretch firstly in the longitudinal direction, i.e. the forward direction through the film stretching machine, and then in the transverse direction. A stretched substrate film may be, and preferably is, dimensionally stabilised by heat-setting under dimensional restraint at a temperature above the glass transition temperature thereof.

The adherent polyester resin coating medium may be applied to an already oriented film substrate - such as a polyimide film. However, application of the coating medium is preferably effected before or during the stretching operation.

In particular, it is preferred that the adherent coating medium should be applied to the film substrate between the two stages (longitudinal and transverse) of a thermoplastics film biaxial stretching operation. Such a sequence of stretching and coating is especially preferred for the production of a coated linear polyester film substrate, such as a coated polyethylene terephthalate film, which is preferably firstly stretched in the longitudinal direction over a series of rotating rollers, coated with the adherent layer, and then stretched transversely in a stentar oven, preferably followed by heat setting.

Prior to deposition of the adherent polyester resin onto the polymeric substrate the exposed surface thereof may, if desired, be subjected to a chemical or physical surface-modifying treatment to improve the bond between that surface and the subsequently applied polyester resin layer. A preferred treatment, because of its simplicity and effectiveness, which is particularly suitable for the treatment of a polyester substrate, is to subject the exposed surface of the substrate to a high voltage electrical stress accompanied by corona discharge. Alternatively, the substrate may be pretreated with an agent known in the art to have a solvent or swelling action on the substrate polymer. Examples of such agents, which are particularly suitable for the treatment of a polyester substrate, include a halogenated phenol dissolved in a common organic solvent e.g. a solution of p-chloro-m-cresol, 2,4-dichlorophenol, 2,4,5-or 2,4,6-trichlorophenol or 4-chlororesorcinol in acetone or methanol.

An adherent polyester resin coating may be applied to one or each surface of the polymeric substrate, and one or each adherent polyester resin layer may be subsequently metallised. Alternatively, one surface of the substrate may be uncoated, or may be coated with a layer or a material other than the herein specified sulphonic acid containing polyester resin medium. For example, a pressure sensitive adhesive layer may be deposited on the metallised surface of a substrate.

The adherent composition may be applied to the polyester film as an aqueous dispersion or a solution in an organic solvent by any suitable conventional coating technique such as dip coating, bead coating, reverse roller coating or slot coating.

Modification of the surface of the copolymeric subbing layer, e.g. by flame treatment, ion bombardment, electron beam treatment, ultra-violet light treatment or preferably by corona discharge, may improve the adhesion of the metallised layer but may not be essential to the provision of satisfactory adhesion.

The preferred treatment by corona discharge may be effected in air at atmospheric pressure with conventional equipment using a high frequency, high voltage generator, preferably having a power output of from 1 to 20 kw at a potential of 1 to 100 kv. Discharge is conveniently accomplished by passing the film over a dielectric support roller at the discharge station at a linear speed preferably of 1.0 to 500 m per minute. The discharge electrodes may be positioned 0.1 to 10.0 mm from the moving film surface.

Satisfactory adhesion of a metallised layer applied directly to the surface of the adherent polyester resin layer can however be achieved without any prior surface modification, e.g. by corona discharge treatment. An example of an adherent polyester resin layer which provides adequate adhesion without corona discharge treatment is a 90:10:100 mole % isophthalic acid: sulphoisophthalic acid: diethylene glycol.

Deposition of a metallic layer onto the, or each, adherent polyester resin layer may be effected by conventional metallising techniques - for example, by deposition from a suspension of finely-divided metallic particles in a suitable liquid vehicle, or by electron beam evaporation, electroless plating, or preferably, by a vacuum deposition process in which a metal is evaporated onto the adherent resin surface in a chamber maintained under conditions of high vacuum. Suitable metals include palladium, titanium, chromium, nickel, copper (and alloys thereof, such as bronze), silver, gold, cobalt and zinc, but aluminium is to be preferred for reasons both of economy and ease of bonding to the resin layer.

Metallising may be effected over the entire exposed surface of the adherent resin layer or over only selected portions thereof, as desired.

Metallised films in accordance with the present invention may be prepared in a range of thicknesses governed primarily by the ultimate application for which a particular film is to be employed. Films, having a total thickness in a range extending from 2.5 to 250 $\mu$m are of general utility, although for packaging applications a packaging film of from about 10 to 50 $\mu$m in total thickness is generally suitable.

The ratio of substrate to adherent polyester resin layer thickness may vary within a wide range, although the thickness of the resin layer preferably should not be less than 0.004% nor greater than 10% of that of the substrate. In practice, the thickness of the polyester resin layer is desirably at least 0.01 $\mu$m and preferably should not greatly exceed about 1.0 $\mu$m. The metallic layer is conveniently deposited in a thickness from monoatomic proportions to about 50 μm or greater, although a preferred range is from 0.005 to 15.0 μm, and particularly from 0.01 to 0.5 μm.

One or more of the polymeric layers of a metallised film according to the invention may conveniently contain any of the additives conventionally employed in the manufacture of thermoplastics polymeric films. Thus, agents such as dyes, pigments, voiding agents, lubricants, anti-oxidants, anti-blocking agents, surface active agents, slip aids, gloss-improvers, prodegradants, ultra-violet light stabilisers, viscosity modifiers and dispersion stabilisers may be incorporated in the substrate and/or adherent resin layer(s), as appropriate. In particular an adherent resin layer, and/or a substrate, may comprise a particulate filler, such as silica, of small particle size. Desirably, a filler, if employed in an adherent resin layer, should be resent in an amount not exceeding 50% by weight of the adherent resin, and the particle size thereof should not exceed 0.5 μm, preferably less than 0.3 μm, and especially from 0.005 to 0.2 μm. A filler, if employed in a substrate layer, should be present in a small amount, not exceeding 0.5%, preferably less than 0.2%, by weight of the substrate. The haze characteristics of a polymeric film containing a filler of larger particle size are such that a metallised film prepared therefrom exhibits an undesirable dull appearance.

Application of decorative and/or descriptive matter to the films of the invention may be effected by conventional printing techniques, for example - by printing an inked pattern directly onto the metallic surface of the film and, optionally, protecting the printed matter by a layer of a protection lacquer. Alternatively, reverse printing techniques may be employed whereby the printed matter is embedded in the film at an interlayer position.

Films according to the invention are of utility in a wide range of applications including decorative drapes, reflective screens, mirrors, solar panels, electrical circuit boards, capacitors, magnetic recording media and packaging wraps and pouches. Such films are of particular utility as the internal liner of bag-in-the-box containers for wines, beer and carbonated drinks.

The invention is illustrated by reference to the accompanying drawings in which

FIG. 1 is a schematic sectional elevation, not to scale, of a polyester film having a single metallic surface layer.

FIG. 2 is similar schematic elevation of a polyester film having respectively a metallic and an adherent resin surface layer, FIG. 3 is a similar schematic elevation of a polyester film metallised on both opposed surfaces.

Referring to FIG. 1 of the drawings, the film comprises a polyester substrate layer (1) having a metallic layer (2) bonded to one surface (3) thereof by an intermediate adherent layer (4) of a polyester resin composition according to the invention. Surface (5) of the substrate, remote from metallic layer (2), is uncoated.

The film of FIG. 2 additionally comprises a layer (6) of, for example, an adherent layer bonded to the remote substrate surface (5).

The film of FIG. 3 further comprises a second metallic layer (7) bonded to a layer (6) of an adherent layer, layer (6) in turn being directly bonded to substrate surface (5).

The invention is further illustrated by reference to the following Examples.

EXAMPLE 1

An aqueous sample (30% wt solids) of commercially available Eastman WD Size having a sodium content of 2800 ppm, i.e. 0.0405 gramme atoms present on the solids resin content, was passed through a mixedbed deionisation column. The sodium content of the deionised solution was found to be 25 ppm, i.e. 0.00036 gramme atoms percent.

A polyethylene terephthalate film was melt extruded, cast onto a cooled rotating drum and stretched in the direction of extrusion to approximately 3 times its original dimensions. The cooled stretched film was then coated with an aqueous composition containing the following ingredients:

| | |
|---|---|
| Deionised Eastman WD Size (aqueous dispersion comprising 30% by weight of a polyester of isophthalic acid, sulphonisophthalic acid and diethylene glycol) | 8.33 liters |
| 'Ludox' HS40 (colloidal silica dispersion of mean particle size 12 nm, manufactured by Dupont, 40% by weight) | 72 5 ml |
| 'Tween' 20 (a polyoxyethylene sorbitan monolaurate - supplied by Atlas) | 40 g |

Water-added to give a coating composition of total volume 50 litres.

The pH of the composition was adjusted to appoximately 8.5 by the addition of ammonia.

The polyethylene terephthalate film was coated on one side to give a wet coating thickness of approximately 3 μm.

The coated film was passed into a stenter oven, where the film was dried and stretched in the sideways direction to approximately 3 times its original dimensions. The biaxially stretched coated film was heat set at a temperature of about 200° C. by conventional means. Final film thickness was 12 μm.

The coated side of the film was metallised by a conventional evaporative method to give a layer of aluminium of approximately 500 Å. The metallised film was subjected to a standard peel strength test in order to determine the failure resistance of the laminate. Samples of the metallised film were heat sealed is the metal layer was sealed to a dry adhesive film tape. The seal was achieved using a 'Sentinel' heat-sealer operating at a jaw temperature of 105° C., dwell time of 1 second and jaw pressure of 50 psi ($3.45 \times 10^5 \mathrm{Nm}^{-2}$). This produced a seal 25 mm wide across the sample.

Peel specimens were prepared by cutting 25 mm wide strips at right angles to the seal, giving a sealed area of 25 mm on each sample, with an unsealed 'tail' at least 100 mm long. Five such specimens were cut from each sealed metallised sample, and the adhesion was measured by peeling apart each specimen using an 'Instron' Tensometer at a peel speed of 200 mm min⁻. The peel load was recorded for each specimen and the amount of aluminium transferred to the dry adhesive tape was visually assessed in each case. Results are given in Table 1.

EXAMPLE 2

This is a comparative example not according to the invention. Example 1 was repeated except that the polymeric coating stage was omitted. The uncoated polyethylene terephthalate film was metallised as described in Example 1, and the results of the peel strength test are given in Table 1.

TABLE 1

| Example | Peel Strength g/25 mm | Aluminium removed % |
| --- | --- | --- |
| 1 | 1000* (392.3 Nm$^{-1}$) | 0 |
| 2 (comparative) | 200 (78.5 Nm$^{-1}$) | 90 |

*laminate failed due to film breakage. There was no delamination between the metal layer and polymeric coating.

EXAMPLE 3

The procedure of Example 1 was repeated except that 10% by weight relative to Deionised Eastman WD Size of a melamie-formaldehyde resin (commercially available as 'Cymel' 300) was added to the aqueous coating composition. The cross-linked coated polyethylene terephthalate was metallised as described in Example 1, and the peel strength test results and aluminium removal values were comparable to those achieved for the uncross-linked coated film.

The superior peel strength of, and resistance to removal of aluminum from, metallised films of the present invention is evident from the above results.

What is claimed:

1. A metallized film comprising a substrate layer of a synthetic polymeric material having, on at least one surface thereof, an adherent layer, and a metallic layer on the surface of the at least one adherent layer remote from the substrate, wherein the adherent layer comprises a copolyester resin derived from p1 (a) an aromatic polycarboxylic acid, or polyester-forming equivalent thereof,
    (b) a sulphonic acid derivative of an aromatic polycarboxylic acid, or polyester-forming equivalent thereof, and
    (c) a stoichiometric amount of at least one polyhydric alcohol, or polyester-forming equivalent thereof, wherein the copolyester resin comprises not more than 0.005 gramme atoms percent of an alkali metal.

2. A film according to claim 1 wherein the alkali metal content of the adherent copolyester resin is not more than 0.0005 gramme atoms percent.

3. A film according to claim 1 wherein the adherent copolymer resin comprises from 60 to 98 mole % of component (a) and from 2 to 20 mole % of component (b) together with a stoichiometric amount of component (c).

4. A film according to claim 1 wherein the adherent resin comprises a residue (d) of an aliphatic or cycloaliphatic dicarboxylic acid in an amount of from 0 to 38 mole % of the total acid components.

5. A film according to claim 1 wherein the polyhydric alcohol comprises an aliphatic alkylene-oxy-glycol.

6. A film according to claim 5 wherein the adherent resin comprises residues of isophthalic acid, sulphoisophthalic acid and diethylene glycol.

7. A film according to claim 1, wherein the adherent copolymer layer is at least partially cross-linked.

8. A film according to claim 1 wherein the substrate comprises a biaxially oriented film of polyethylene terephthalate.

9. A method of producing a metallised film by forming a substrate layer of a synthetic polymeric material, applying to at least one surface thereof an adherent layer, and depositing a metallic layer on the surface of the at least one adherent layer remote from the substrate, wherein the adherent layer comprises a copolyester resin derived from
    (a) an aromatic polycarboxylic acid, or polyester-forming equivalent thereof,
    (b) a sulphonic acid derivative of an aromatic polycarboxylic acid, or polyester-forming equivalent thereof, and
    (c) a stoichiometric amount of at least one polyhydric alcohol, or polyester forming equivalent thereof, wherein the copolymer resin comprises not more than 0.005 gramme atoms percent of an alkali metal.

10. A method according to claim 9 wherein the substrate is a polyethylene terephthalate film which is biaxially oriented by sequential stretching in two mutually perpendicular directions, the adherent polyester coating resin being applied to the film substrate between the two stages (longitudinal and transverse) of the biaxial stretching.

11. A method according to claim 9 wherein the alkali metal content of the copolyester resin is adjusted to the desired level, the pH of the resin is adjusted to 7.0 or greater by application of a neutralising medium, the neutralised resin is applied to the substrate, an the neutralising medium is then removed.

* * * * *